United States Patent [19]
Pittikoun et al.

[11] Patent Number: 5,691,223
[45] Date of Patent: Nov. 25, 1997

[54] METHOD OF FABRICATING A CAPACITOR OVER A BIT LINE DRAM PROCESS

[75] Inventors: Saysamone Pittikoun; Min-Liang Chen, both of Hsinchu, Taiwan

[73] Assignee: Mosel Vitelic Inc., Taiwan

[21] Appl. No.: 772,210

[22] Filed: Dec. 20, 1996

[51] Int. Cl.$^6$ .................................. H01L 21/8242
[52] U.S. Cl. ........................... 437/52; 437/60; 437/919; 437/950; 437/931
[58] Field of Search ........................ 437/47, 52, 60, 437/950, 954, 200, 931, 26; 148/DIG. 144

[56] References Cited

U.S. PATENT DOCUMENTS

| | | | |
|---|---|---|---|
| 5,248,628 | 9/1993 | Okabe et al. | 437/47 |
| 5,432,116 | 7/1995 | Keum et al. | 437/60 |
| 5,460,999 | 10/1995 | Hong et al. | 437/60 |

*Primary Examiner*—Jey Tsai
*Attorney, Agent, or Firm*—Bacon & Thomas

[57] ABSTRACT

The present invention relates to a method of forming a capacitor over a bit line. A thick field oxide (FOX) region is formed to provide isolation between devices on the substrate. Next, a silicon dioxide layer is created on the top surface of the substrate to serve as the gate oxide for isolation. A doped polysilicon layer is then formed over the FOX region and the silicon dioxide layer. Next, a photolithography and an etching steps are used to form a gate structure and a word line. An undoped polysilicon layer is formed on the gate structure, the word line and the substrate. An ion implantation is used through the source/drain masking to form the source/drain. A tungsten silicon (WSi$_x$) layer is subsequently deposited on the surface of the polysilicon layer for increasing conductivity of the polysilicon layer. Subsequently, an etching process is used to creat a bit line and intermediate interconnections. A first dielectric layer is deposited on the gate structure, the bit line and the intermediate interconnections. Then a photoresist is patterning on the first dielectric layer. Then an etching process is used to etching the first dielectric layer. A capacitor is then formed on the first dielectric layer.

33 Claims, 7 Drawing Sheets

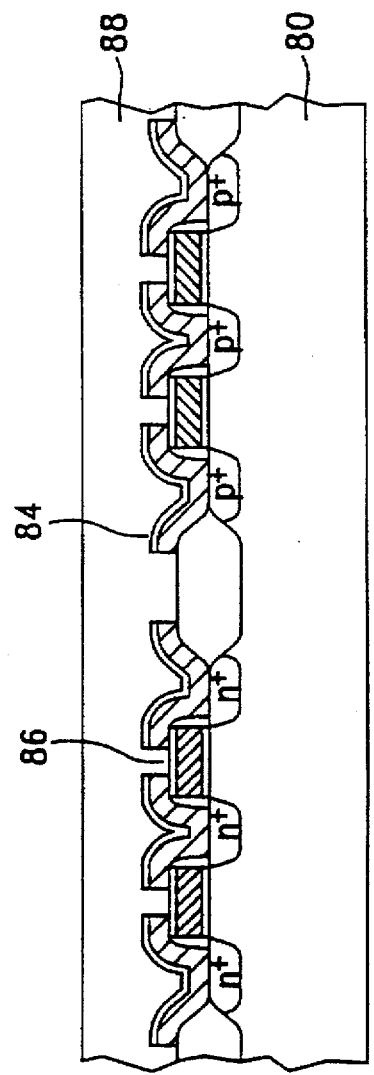
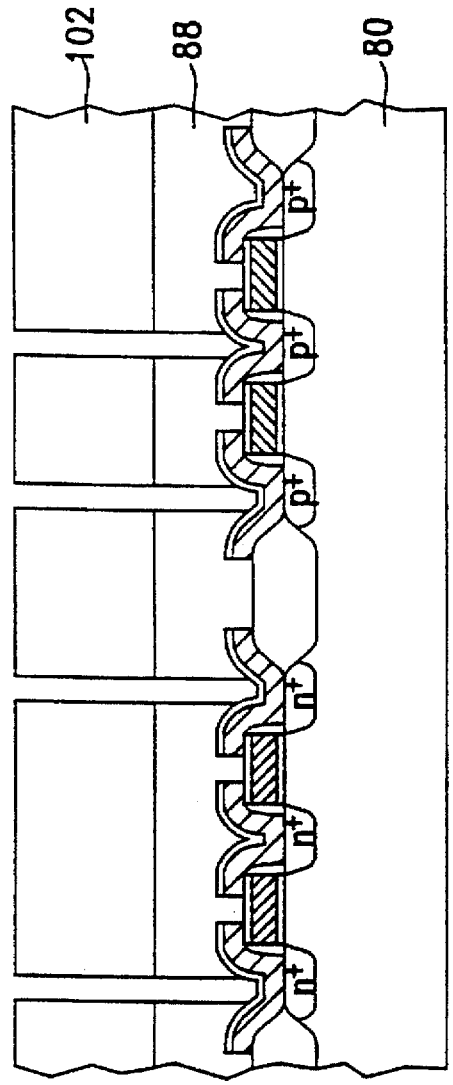
FIG. 14B
FIG. 15B
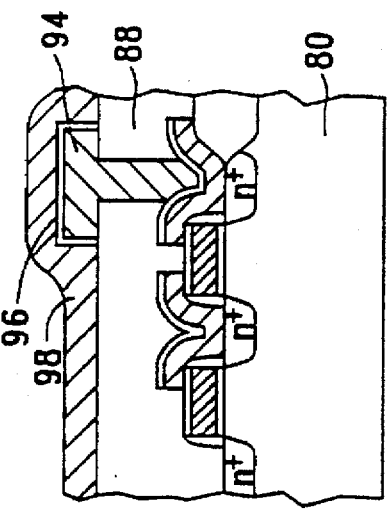
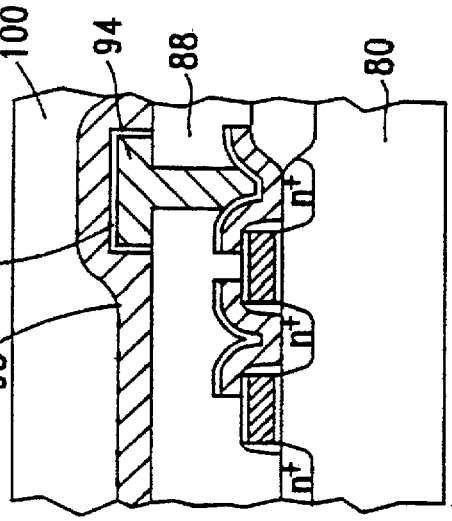
FIG. 14A
FIG. 15A

METHOD OF FABRICATING A CAPACITOR OVER A BIT LINE DRAM PROCESS

FIELD OF THE INVENTION

The present invention relates to a method of fabricating a semiconductor device, and more specifically, to a method of forming a capacitor over a bit line.

BACKGROUND OF THE INVENTION

The earliest DRAMs (Dynamic Random Access Memory) used three-transistor cells and were fabricated using PMOS technology. However, DRAM cells consisting of only one transistor and one capacitor are quickly implemented, and such cells have been used in DRAMs ever since. Indeed, a memory cell is provided for each bit stored by a DRAM device. Each memory cell typically consists of a storage capacitor and an access transistor. Either the source or drain of the access transistor is connected to one terminal of the capacitor. The other side of the transistor and the transistor gate electrode are connected to external connection lines called a bit line and a word line, respectively. The other terminal of the capacitor is connected to a reference voltage. To write a one in to the cell, 5V are applied to the bit line, and 5-V pulse is simultaneously applied to the word line. The access transistor is turned 'ON' by this plus. Under this condition, it represents a binary one. For writing a zero, the bit line voltage is returned to 0V, and the word line is again pulsed to 5 and with the access transistor turned 'ON'. This condition represents a stored binary zero.

The DRAM has also been used as a technology driver over a large part of its life, since it makes a good test vehicle for advancing silicon integrated-circuit process technology. The formation of a DRAM memory cell comprises the formation of a transistor, a capacitor and contacts to external circuits. The capacitor type that has been typically used in DRAM memory cells are planar capacitors, because they are relatively simple to manufacture. The reduction in memory cell area is required for high density DRAM ULSIs. This causes reduction in capacitor area, resulting in the reduction of cell capacitance. In addition, in order to achieve high performance (i.e. high density) DRAM devices, the memory cells must be scaled down in size to the submicrometer range. It has been the trend in integrated circuit technology to increase the density of semiconductor devices per unit area of silicon wafer. DRAM memory cells have used planar capacitor for the simplicity of manufacturing. In this case, where the areas of charge storage capacitors are also decreased and the capacitance becomes small, a decrease in storage capacitance leads to lowered signal-to-noise ratios and errors due to alpha particle hits. Additionally, as the capacitance decreases, the charge held by storage capacitor must be refreshed often. A simple stacked capacitor can not provide sufficient capacitance, even with high dielectric $Ta_2O_5$.

Prior art approaches to overcoming these problems have resulted in the development of the trench capacitor (see for example U.S. Pat. No. 5,374,580) and the stacked capacitor (see for example U.S. Pat. No. 5,021,357). The problem with the trench capacitor is that the gate-diode structure which will cause the well known problem of "gated diode leakage". Reducing the thickness of the dielectric also can improve the capacitance of the capacitor, but this approach is limited because of yield and reliability problems. Yet another prior capacitor cell has been disclosed in U.S. Pat. No. 5,302,540. This prior art provides a capacitor having a first conductive layer with a plurality of cylindrical sections, a dielectric layer over the first conductive layer, and a second conductive layer formed over the dielectric layer.

Another structure of DRAMs is a capacitor over bit line (COB) cell. (see "CAPACITOR OVER BIT LINE CELL WITH HEMISPHERICAL-GRAIN STORAGE NODE FOR 64 Mb DRAMs", M. Sakao et al., microelectronics research laboratories, NEC Corporation. The COB cell has a advantage over a "bit-line over capacitor" structure in that the reduction of the space of each storage node to less than minimum feature size allows for increased storage capacitor size.

Traditional CMOS process form their source/drain areas in silicon by implanting dopants through a thin oxide layer, followed by a thermal cycle to out-diffure dopants as well as annel defects insilicon. Also, contact implants through masking steps are usually necessary in order to lower contact resistances as well as compensate for misalignments.

SUMMARY OF THE INVENTION

A thick field oxide (FOX) region is formed to provide isolation between devices on the substrate.

Next, a silicon dioxide layer is created on the top surface of the substrate to serve as the gate oxide for isolation.

A doped polysilicon layer is then formed over the FOX region and the silicon dioxide layer using a Low Pressure Chemical Vapor Deposition (LPCVD) process. Next, a photolithography and an etching steps are used to form a gate structure and a word line. An undoped polysilicon layer is formed on the gate structure, the word line and the substrate. An ion implantation is used through the source/drain masking to form the source/drain. Further, a portion of the undoped polysilicon that is uncovered by the source/drain maskings is doped by these ions while ion implantation is performed.

A tungsten silicon ($WSi_x$) layer is subsequently deposited on the surface of the polysilicon layer for increasing conductivity of the polysilicon layer. Subsequently, an etching process is used to create a bit line and intermediate interconnections. A first dielectric layer is deposited on the gate structure, the bit line and the intermediate interconnections. Then a photoresist is patterned on the first dielectric layer. Then an etching process is used to etch the first dielectric layer.

Another embodiment of the present invention is the formation of a COB DRAM cell together with periphery on a substrate. A gate structure, an interconnection in cell region and gate structures, interconnection in the periphery region can be simultaneously formed by this method as above described.

Next, a first dielectric layer is formed on the cell region and the periphery region. The first dielectric layer is composed of BPSG. Next, a photoresist is patterned on the periphery region to expose the cell region. Then an etching process is used to etch the first dielectric layer to form a contact hole. A capacitor is subsequently formed on the contact hole.

Then a second dielectric layer is deposited on the first dielectric layer. A photoresist is then patterned on the second dielectric layer to define contact hole regions. A plurality of contact holes are formed by using etching process to etch the first dielectric layer and the second dielectric layer. Tungsten plugs are then formed in the contact holes. A plurality of metal lines are exactly formed on the tungsten plugs. Finally, a third dielectric layer is formed on the metal lines and the second dielectric layer.

Thus a COB DRAM cell together with periphery on a substrate is formed as above described.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein:

FIGS. 12A–12B, 13A–13B, 14A–14B, 15A–15B, 16A–16B are cross section views of a semiconductor wafer illustrating the steps of forming a third embodiment in accordance with the present invention.

DETAILED DESCRIPTION OF THE PREFERRED EMBODIMENT

In the present invention, a new method is disclosed to fabricate a capacitor over a bit line (COB). The feature of the present invention is that an ion implantation is performed through a undoped polysilicon layer into the substrate and to form both raised self-aligned source/drain areas with implant damage free Si surface and self-aligned bit-line connection. Further, the cell region and the periphery region (interconection among cells) can be simultaneously formed by this method, it does not need maskings for contact implantation in this method. The application of this method can be used to fabricate (1)a COB DRAM cell (2)periphery and (3)a COB DRAM cell together with periphery. These preferred embodiments will be respectively described as follows.

The formation of the present invention includes many processes that are well known in the art. For example, the process of photolithography masking and etching is used extensively herein. This photolithography masking and etching process are referred to as "patterning and etching." These processes are well known in the art and are used extensively herein without a detailed discussion of this well known technology.

Figure 1:
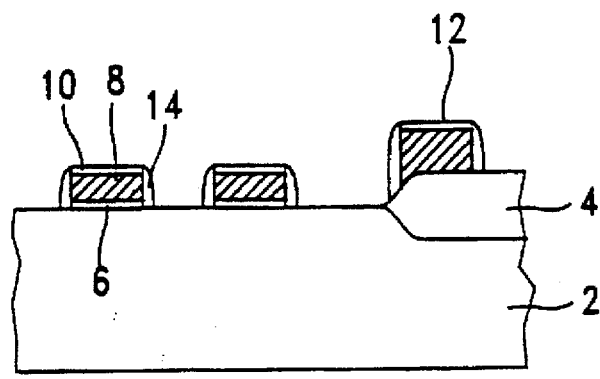
FIG. 1–FIG. 5 are cross section views of a semiconductor wafer illustrating the steps of forming a first embodiment in accordance with the present invention.

Referring to FIG. 1, a P type single crystal silicon substrate 2 with a <100> crystallographic orientation, is provided. A thick field oxide (FOX) region 4 is formed to provide isolation between devices on the substrate 2. The FOX region 4 is created in a conventional manner. For example, the FOX region 4 can be formed via photolithography and dry etching steps to etch a silicon nitride-silicon dioxide composition layer. After the photoresist is removed and wet cleaned, thermal oxidation in an oxygen-steam environment is used to grow the FOX region 4 to a thickness of about 4000–6000 angstroms.

Next, a silicon dioxide layer 6 is created on the top surface of the substrate 2 to serve as the gate oxide for isolation. In one embodiment, the silicon dioxide layer 6 is formed by using an oxygen-steam ambient, at a temperature of about 850°–1000° C. Alternatively, the oxide layer 6 may be formed using any suitable oxide chemical compositions and procedures. In this embodiment, the thickness of the silicon dioxide layer 6 is approximately 100 angstroms.

A doped polysilicon layer 8 is then formed over the FOX region 4 and the silicon dioxide layer 6 using a Low Pressure Chemical Vapor Deposition (LPCVD) process. In this embodiment, the polysilicon layer 8 has a thickness of about 1500–2000 angstroms. A silicon nitride layer 10 is formed on the polysilicon layer 8. Next, a photolithography and an etching steps are used to form a gate structure and a word line 12. Sidewall spacers 14 are subsequently formed on the sidewalls of the gate structure. The sidewall spacers 14 are created by forming a silicon nitride layer on the substrate then an anisotropic etching is used to etch the silicon oxide layer.

Figure 2:
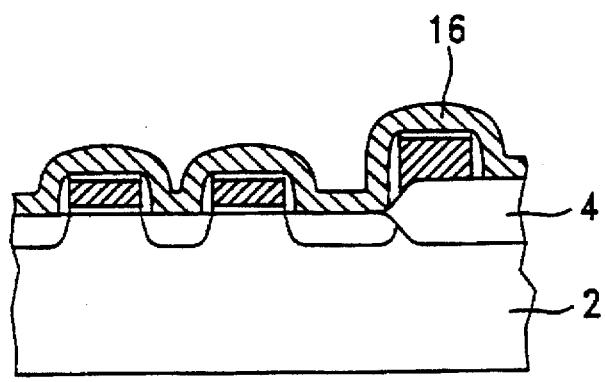

Next, as shown in FIG. 2, a undoped polysilicon layer 16 is formed on the gate structure, the word line 12 and the substrate 2. In preferred embodiment, the thickness of the undoped polysilicon layer is about 1000–2000 angstroms. An ion implantation is used through the a portion of the undoped polysilicon layer 16 to form the source/drain. Further, a portion of the undoped polysilicon 16 that is uncovered by the source/drain maskings is doped by these ions while the ion implantation is performed. The dosage of the source/drain is 4E15 atoms/cm$^2$ while the energy of the implantation is 40 KeV. The advantage of this step is that self-aligned source/drain areas with implant damage free Si surface is formed by the ion implantation. That is to say the method is used for preventing a substrate from damage by ion implantation. In addition, a bit line region and a intermediate interconnection region are self-aligned defined by ions doped into the portion of the polysilicon where is uncovered by implanting masking.

Figure 3:
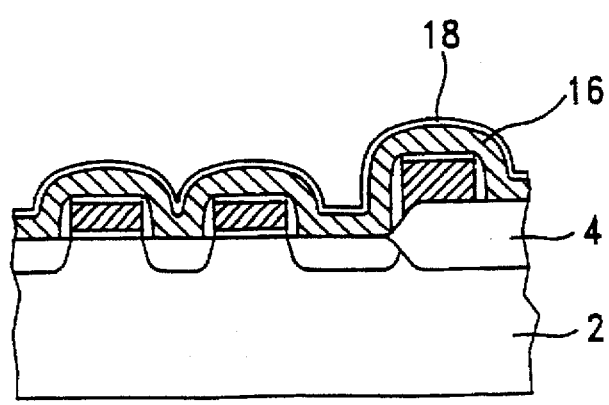
Figure 4:
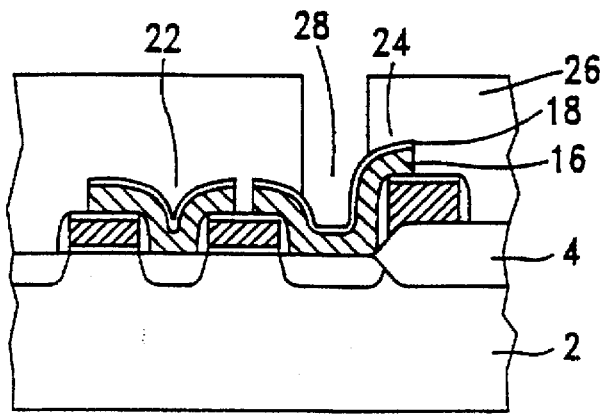

Turning to FIG. 3, a tungsten silicon (WSi$_x$) layer 18 is subsequently deposited by well known technology on the surface of the polysilicon layer 16 for increasing conductivity of the polysilicon layer 16. The thickness of the WSi$_x$ layer 18 is about 1000 angstroms. Turning to FIG. 4, a photoresist 20 is patterned on the WSi$_x$ layer 18. Subsequently, an etching process is used to create a bit line 22 and intermediate interconnections 24. The etchant of the etching is preferably composed of HBr. The benefit of this step is that a self-aligned bit-line connection is created by the process. Referring to FIG. 4, a first dielectric layer 26 is deposited on the gate structure, the bit line 22 and the intermediate interconnections 24. In the preferred embodiment, the first dielectric layer 26 is composed of BPSG and has a thickness about 4000 angstroms. Then a photoresist is patterning on the first dielectric layer 26. Then an etching process is used to etch the first dielectric layer 26 to form a contact hole 28.

Figure 5:
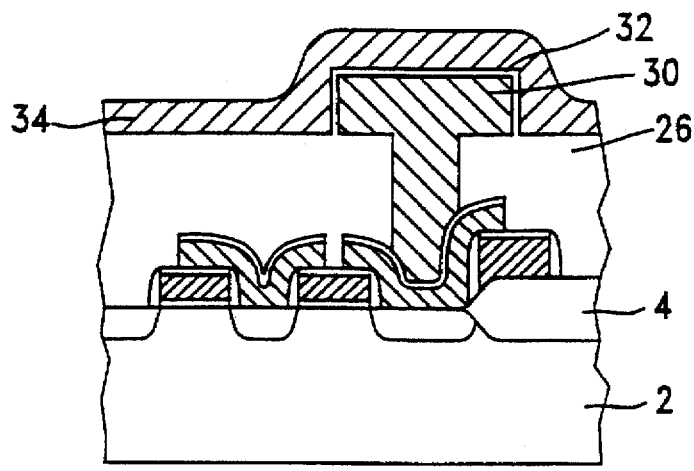

Referring to FIG. 5, a first conductive layer 30 is formed over and in the contact hole 28 and on the first dielectric layer 26. The first conductive layer 30 is preferably chosen from doped polysilicon or in-situ doped polysilicon. Next, patterning and etching is used to form a bottom storage node by etching the first conductive layer 30. A dielectric film 32 is deposited along the surface of the first conductive layer 30. The dielectric film 32 is preferably formed of either a double film of nitride/oxide film, a triple film of oxide/nitride/oxide, or any other high dielectric film such as tantalum oxide(Ta$_2$O$_5$). Finally, a second conductive layer 34 is deposited using a conventional LPCVD process over the dielectric film 32. The second conductive layer 34 provides a top storage electrode and is formed of doped polysilicon, in-situ doped polysilicon. One of the terminals of said capacitor is contacted with said intermediate interconnection via said contact hole. Thus, a semiconductor capacitor over bit line DRAM cell is formed.

The application of the present invention can be also used in the formation of the periphery. The preferred embodiments is described as follows.

Figure 6:
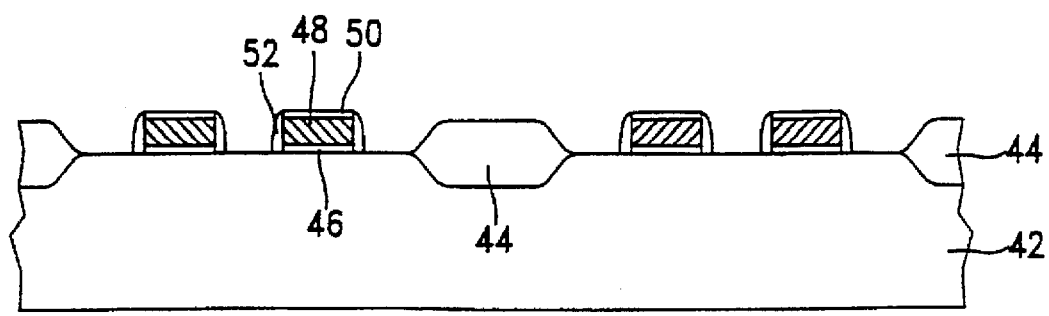
FIG. 6–FIG. 11 are cross section views of a semiconductor wafer illustrating the steps of forming a second embodiment in accordance with the present invention.

Referring to FIG. 6, a P type single crystal silicon substrate 42 with a <100> crystallographic orientation, is provided. Thick field oxide (FOX) regions 44 are formed to provide isolation between devices on the substrate 42. The FOX regions 44 are created in a conventional manner to a thickness of about 4000–6000 angstroms.

Next, a silicon dioxide layer 46 is created on the top surface of the substrate 42 to serve as the gate oxide for isolation. In one embodiment, the silicon dioxide layer 6 is formed by using an oxygen ambient, at a temperature of about 850°–1000° C. The thickness of the silicon dioxide layer 46 is approximately 100 angstroms.

A doped polysilicon layer 48 is then formed over the FOX regions 44 and the silicon dioxide layer 46 using a Low Pressure Chemical Vapor Deposition (LPCVD) process. In this embodiment, the polysilicon layer 48 has a thickness of about 1500–2000 angstroms. A silicon nitride layer 50 is formed on the polysilicon layer 48 to a thickness about 2000 angstroms. Next, a photolithography and an etching steps are used to form a plurality of gate structures. Sidewall spacers 52 are subsequently formed on the sidewalls of the polysilicon layer 48. The sidewall spacers 52 are created by well known technology.

Figure 7:
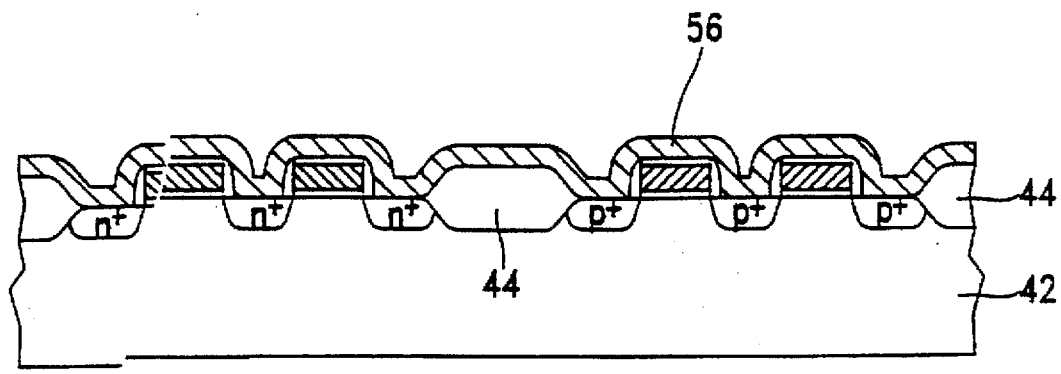

Next, as shown in FIG. 7, a undoped polysilicon layer 56 is formed on the gate structures and the substrate 42. In preferred embodiment, the thickness of the undoped polysilicon layer is about 1000–2000 angstroms. Ion implantations are respectively used through the p and n source/drain masking to form the p source/drain and n source/drain, respectively. In addition, a portion of the undoped polysilicon 56 that is uncovered by the p or n source/drain maskings is doped by these ions while the ion implantations are performed. The dosage of the n source/drain is 4E15 atoms/cm$^2$ while the energy of the implantation is 40 KeV. The dosage of the p source/drain is 3E15 atoms/cm$^2$ and the energy of the implantation is 30 KeV.

Figure 8:
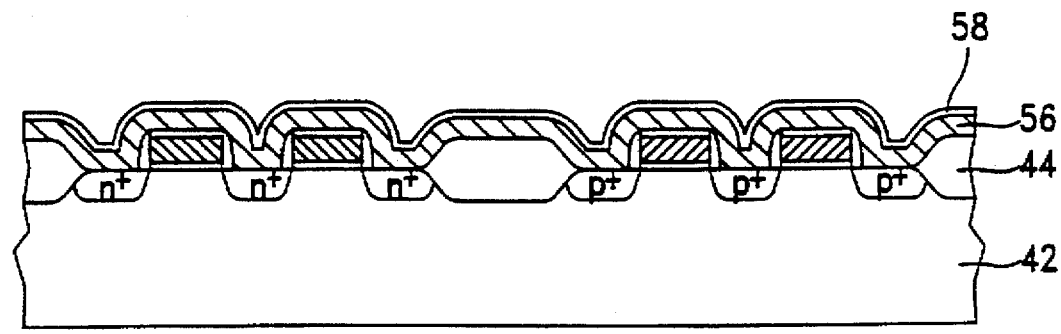

Turning to FIG. 8, the next step of the formation is to form a tungsten silicon (WSi$_x$) layer 58 on the surface of the polysilicon layer 16 for decreasing resistance of the polysilicon layer 56. The thickness of the WSi$_x$ layer 58 is about 1000 angstroms.

Figure 9:
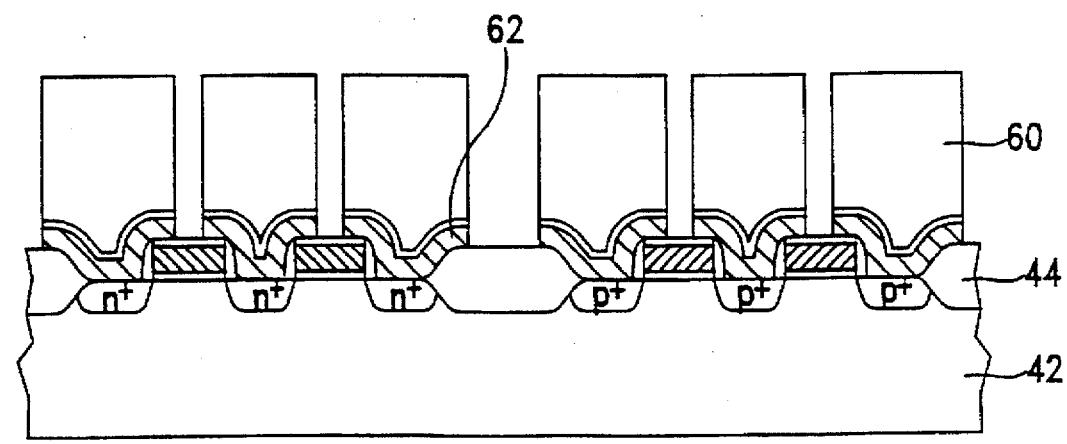

Turning to FIG. 9, a photoresist 60 is patterned on the WSi$_x$ layer 58. Subsequently, an etching process is used to create intermediate interconnections 62. The etchant of the etching is preferably composed of HBr.

Figure 10:
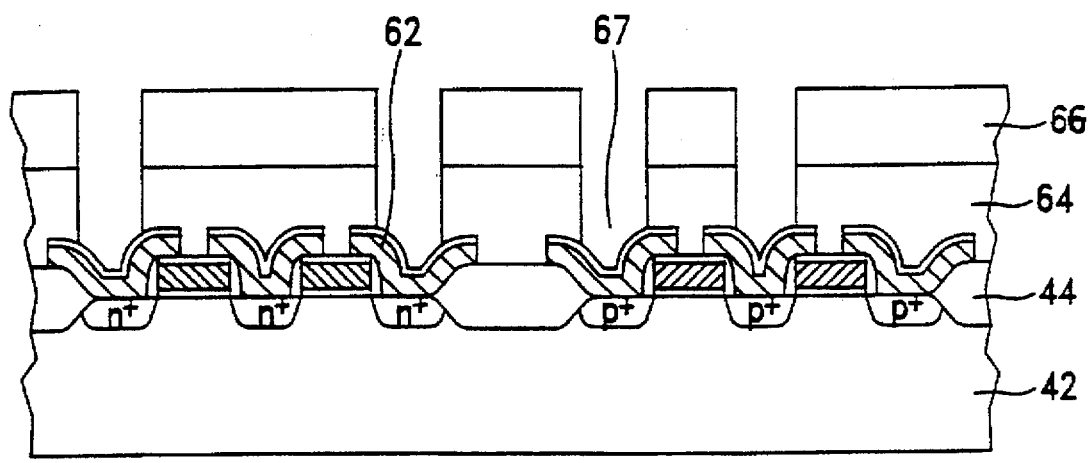

Referring to FIG. 10, a first dielectric layer 64 is deposited on the gate structures, and the intermediate interconnections 62. In the preferred embodiment, the first dielectric layer 64 is composed of BPSG and has a thickness about 3000 angstroms. Then a second dielectric layer 66 is deposited on the first dielectric layer 64 to a thickness about 8000 angstroms. The second dielectric layer is typically formed of SiH$_4$ oxide. A photoresist is then patterned on the second dielectric layer 64. An etching process is performed to etch the first dielectric layer 64 and the second dielectric layer 66 to the intermediate interconnections 62 for forming a plurality of contact holes 67.

Figure 11:
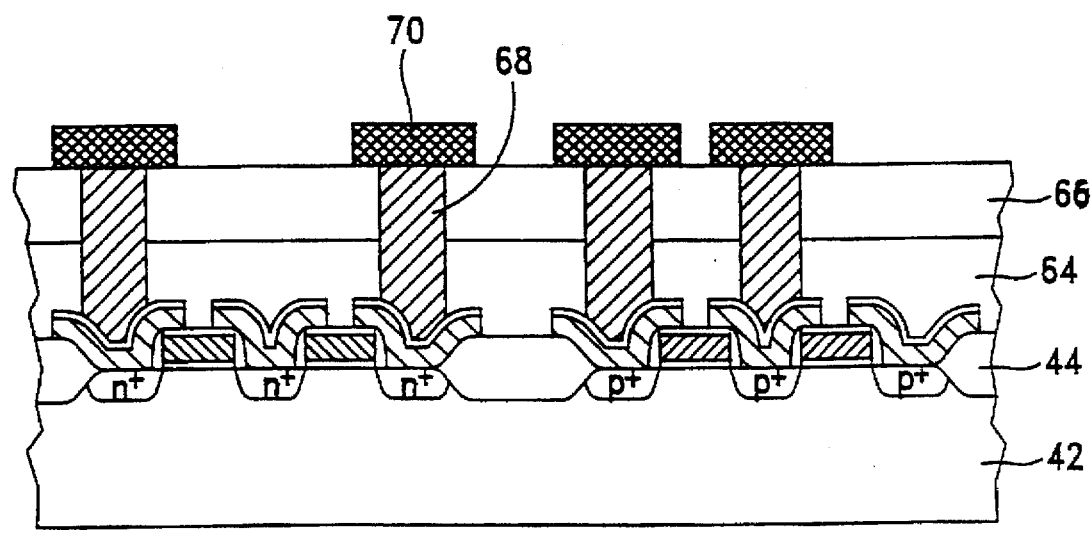

Turning to FIG. 11, tungsten plugs 68 are formed in the contact holes for using as electric connections by well known method. A plurality of metal lines 70 are respectively formed on the tungsten plugs 68. Finally, a third dielectric layer 72 is formed on the metal lines 70 and the second dielectric layer 66.

Figure 12B:
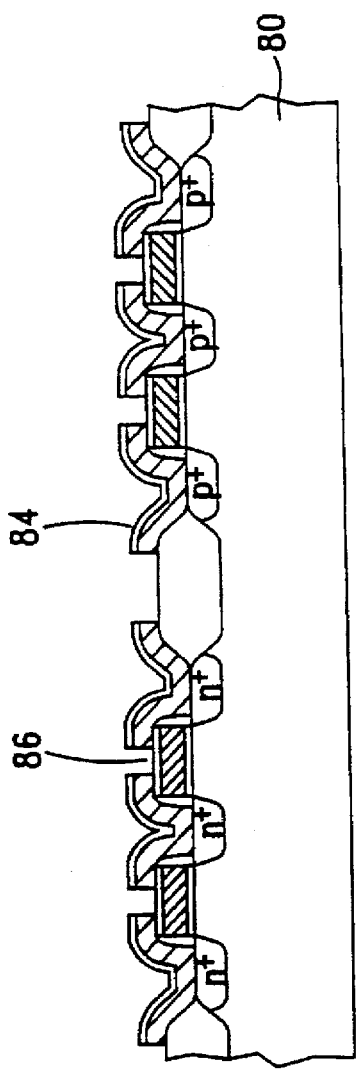
Figure 12A:
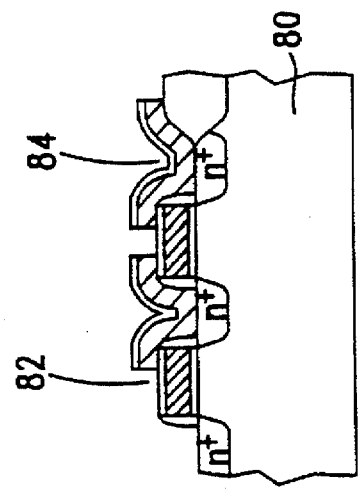

The third embodiment of the present invention is the formation of a COB DRAM cell (FIG. 12 A) together with periphery (FIG. 12B) on a substrate 80. As shown in FIG. 12A, FIG. 12B, a gate structure 82, an interconnection 84 in cell region and gate structures 86, interconnection 84 in the periphery region can be simultaneously formed by this method as above described.

Figure 13B:
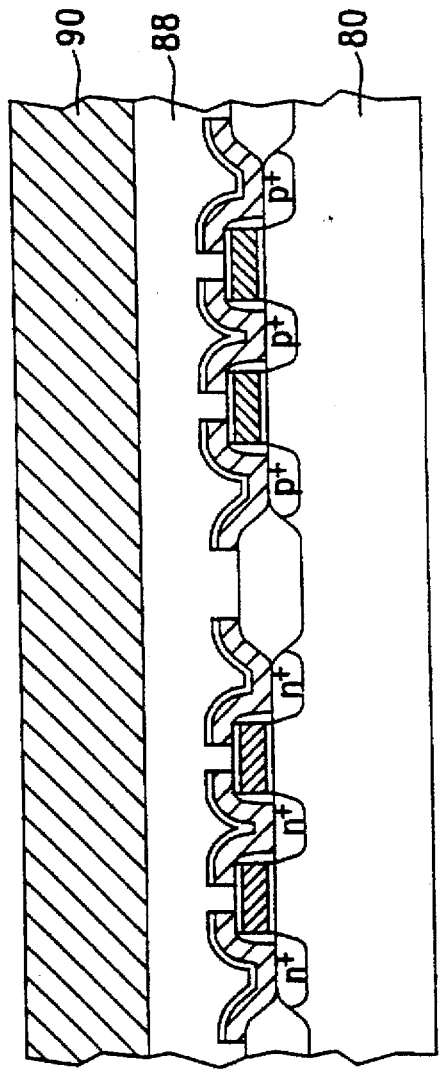
Figure 13A:
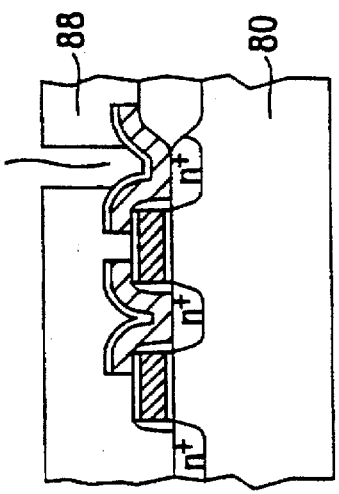

Next, see FIG. 13A, FIG. 13B, a first dielectric layer 88 is simultaneously formed on the cell region (FIG. 13A) and the periphery region (FIG. 13B). The thickness of the first dielectric layer 88 is 3000 angstroms. The first dielectric layer 88 is composed of BPSG. Next, a photoresist is patterned on the periphery region (FIG. 13B) to expose the cell region (FIG. 13A). Then an etching process is used to etch the first dielectric layer 88 which is uncovered by the photoresist to form a contact hole 92.

Referring to FIG. 14A, FIG. 14B, a first conductive layer 94 is formed over and in the contact hole 92 and on the first dielectric layer 88. The first conductive layer 94 is preferably chosen from doped polysilicon, in-situ doped polysilicon or suitable metal. Next, a bottom storage node is formed by patterning and etching the first conductive layer 88. A dielectric film 96 is deposited along the surface of the first conductive layer 94. The dielectric film 96 is preferably formed of either a double film of nitride/oxide film, a triple film of oxide/nitride/oxide, or any other high dielectric film such as tantalum oxide(Ta$_2$O$_5$). Then a second conductive layer 98 is deposited using a conventional LPCVD process over the dielectric film 96. The second conductive layer 98 provides a top storage electrode and is formed of doped polysilicon, in-situ doped polysilicon or metal. Then the photoresist 90 is removed after the capacitor is formed.

As shown in FIG. 15A, FIG. 15B, the next step of the formation is to pattern a photoresist 100 to cover the cell region (FIG. 15A) and expose the peripheryregion (FIG. 15B). Then a second dielectric layer 102 is deposited on the first dielectric layer 88 to a thickness about 8000 angstroms. The second dielectric layer is typically formed of SiH$_4$ oxide. A photoresist is then patterned on the second dielectric layer 102 to define contact hole regions. A plurality of contact holes are formed by using etching process to etch the first dielectric layer 88 and the second dielectric layer 102.

Figure 16B:
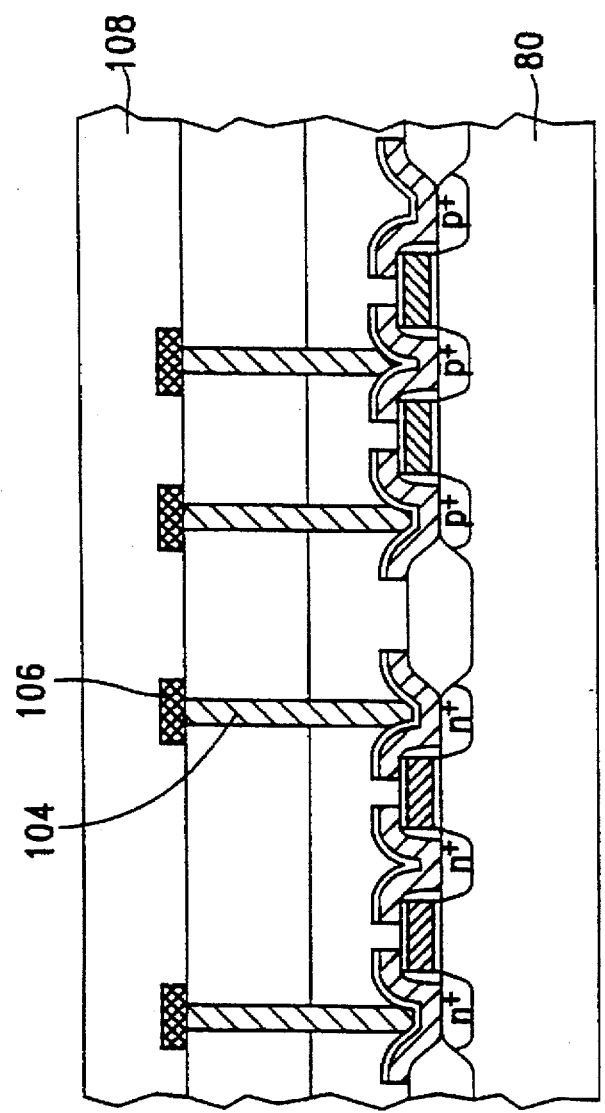
Figure 16A:
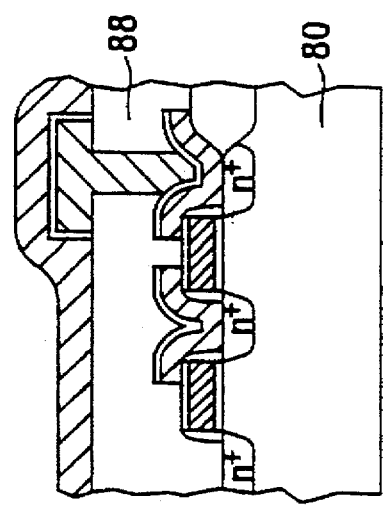

Turning to FIG. 16A, FIG. 16B tungsten plugs 104 are formed in the contact holes. A plurality of metal lines 106 are exactly formed on the tungsten plugs 104. Finally, a third dielectric layer 108 is formed on the metal lines 106 and the second dielectric layer 102.

Thus a COB DRAM cell together with periphery on a substrate is formed as above described.

As will be understood by persons skilled in the art, the foregoing preferred embodiment of the present invention is illustrative of the present invention rather than limiting the present invention. Having described the invention in connection with a preferred embodiment, modification will now suggest itself to those skilled in the art. Thus, the invention is not to be limited to this embodiment, but rather the invention is intended to cover various modifications and similar arrangements included within the spirit and scope of the appended claims, the scope of which should be accorded the broadest interpretation so as to encompass all such modifications and similar structures.

While the preferred embodiment of the invention has been illustrated and described, it will be appreciated that various changes can be made therein without departing from the spirit and scope of the invention.

The embodiments of the invention in which an exclusive property or privilege is claimed are defined as follows:

1. A method of fabricating a MOS transistor on a substrate, said substrate has an isolation region for isolating, said method comprising the steps of:

forming a gate oxide layer on said substrate;

forming a first polysilicon layer on said gate oxide layer;

forming a silicon nitride layer on said first polysilicon layer for serving as a capped layer;

etching said gate oxide layer, said first polysilicon layer and said silicon nitride layer to form a gate structure;

forming sidewall spacers on the sidewall of said gate structure;

forming a second polysilicon layer on said gate structure, said substrate and said isolation region;

patterning a mask on said second polysilicon layer to define source/drain regions;

forming said source/drain regions using ion implantation through said second polysilicon layer;

forming a tungsten silicon layer on said second polysilicon layer for increasing the conductivity of said second polysilicon;

patterning a first photoresist on said tungsten silicon layer;

etching said tungsten silicon layer and said second polysilicon layer to form a bit line; and stripping said first photoresist.

2. The method of claim 1, wherein said first polysilicon layer is formed of doped polysilicon layer.

3. The method of claim 1, wherein said second polysilicon layer is formed of undoped polysilicon layer.

4. The method of claim 1, further comprises forming an intermediate interconnection while said bit line is formed.

5. The method of claim 1, wherein said gate oxide layer is formed to have a thickness about 100 angstroms.

6. The method of claim, 2 wherein said doped polysilicon layer is formed to have a thickness of approximately 1500–2000 angstroms.

7. The method of claim 3, wherein said undoped polysilicon layer is formed to have a thickness of approximately 1000–2000 angstroms.

8. The method of claim 1, wherein said tungsten silicon layer is formed to have a thickness of approximately 1000 angstroms.

9. The method of claim 1, wherein the dosage of said ion implant is about 4E15 atom/cm$^2$.

10. The method of claim 9, wherein the energy of said ion implantation is about 40 eV.

11. The method of claim 1, wherein the etchant of said etch to form said bit line is HBr.

12. A method of fabricating a DRAM cell on a substrate, said substrate has an isolation region for isolating, said method comprising the steps of:

forming a gate oxide layer on said substrate;

forming a first polysilicon layer on said gate oxide layer;

forming a silicon nitride layer on said first polysilicon layer for serving as a capped layer;

etching said gate oxide layer, said first polysilicon layer and said silicon nitride layer to form a gate structure;

forming sidewall spacers on the sidewall of said gate structure;

forming a second polysilicon layer on said gate structure, said substrate and said isolation region;

forming source/drain using ion implantation through said second polysilicon layer, a bit line region is simultaneously self-aligned defined in a portion of said second polysilicon layer by said ion implantation;

forming a tungsten silicon layer on said second polysilicon layer for increasing the conductivity of said bit line region;

patterning a first photoresist on said tungsten silicon layer;

etching said tungsten silicon layer and said second polysilicon layer to form a bit line and a intermediate interconnection;

stripping said first photoresist;

forming a first dielectric layer on said gate structure, said intermediate interconnection and said bit line;

patterning a second photoresist on said first dielectric layer;

etching said first dielectric layer to said intermediate interconnection using said second photoresist as a mask to form a contact hole;

stripping said second photoresist;

forming a capacitor on said first dielectric layer, one of the terminals of said capacitor is contacted with said intermediate interconnection via said contact hole.

13. The method of claim 12, wherein said first polysilicon layer is formed of doped polysilicon layer.

14. The method of claim 12, wherein said second polysilicon layer is formed of undoped polysilicon layer.

15. The method of claim 12, wherein said gate oxide layer is formed to have a thickness about 100 angstroms.

16. The method of claim 12, wherein said first polysilicon layer is formed to have a thickness of approximately 1500–2000 angstroms.

17. The method of claim 14, wherein said second polysilicon layer is formed to have a thickness of approximately 1000–2000 angstroms.

18. The method of claim 12, wherein said tungsten silicon layer is formed to have a thickness of approximately 1000 angstroms.

19. The method of claim 12, wherein the dosage of said ion implant is about the range of 4E15 atom/cm$^2$.

20. The method of claim 19, wherein the energy of said ion implantation is about the range of 40 eV.

21. The method of claim 12, wherein the etchant of said etch to form said bit line is HBr.

22. A method of fabricating a DRAM cell together with periphery region on a substrate, said periphery region serve as interconnections among cells, said substrate has an isolation region for isolating, said method comprising the steps of:

forming a gate oxide layer in said cell and said periphery region on said substrate;

forming a first polysilicon layer on said gate oxide layer;

forming a silicon nitride layer on said first polysilicon layer for serving as a capped layer;

etching said gate oxide layer, said first polysilicon layer and said silicon nitride layer to form a gate structure in said cell and said periphery region;

forming sidewall spacers on the sidewall of said gate structure;

forming a second polysilicon layer on said gate structure, said substrate and said isolation region;

forming p source/drain regions and n source/drain regions respectively using ion implantation technique through said second polysilicon layer, a bit line region is simultaneously self-aligned defined in a portion of said second polysilicon layer;

forming a tungsten silicon layer on said second polysilicon layer for increasing the conductivity of said bit line region;

patterning a first photoresist on said tungsten silicon layer;

etching said tungsten silicon layer and said second polysilicon layer to form a bit line and a intermediate interconnection in said cell, a plurality of interconnects in said periphery region;

stripping said first photoresist; and forming a first dielectric layer on said gate structure, said intermediate interconnection and said bit line in said cell region and in said periphery region.

23. The method of claim 22, further comprises the following steps after forming said first dielectric layer:

patterning a second photoresist on said periphery region to expose said cell;

forming a first contact hole in said first dielectric layer in said cell;

forming a capacitor on said first dielectric layer, one of the terminals of said capacitor is contacted with said intermediate interconnection which is in said cell via said first contact hole;

stripping said second photoresist;

patterning a third photoresist on said cell region to expose said periphery region;

forming a second dielectric layer on said first dielectric layer;

forming a plurality of second contact holes in said first dielectric layer and said second dielectric layer in said periphery region;

forming a plurality of tungsten plugs in said second contact holes;

forming a plurality of metal interconnections exactly on said tungsten plugs; and stripping said third photoresist.

24. The method of claim 22, further comprises the following steps after forming said first dielectric layer:

patterning a second photoresist on said cell to expose said periphery region;

forming a second dielectric layer on said first dielectric layer;

forming a plurality of first contact holes in said first dielectric layer and in said second dielectric layer in said periphery region;

forming a plurality of tungsten plugs in said contact holes;

forming a plurality of metal interconnections exactly on said tungsten plugs;

stripping said second photoresist;

patterning a third photoresist on said periphery region to expose said cell;

forming a second contact hole in said first dielectric layer;

forming a capacitor on said first dielectric layer, one of the terminals of said capacitor is contacted with said intermediate interconnection which is in said cell via said second contact hole; and stripping said third photoresist.

25. The method of claim 22, wherein said gate oxide layer is formed to have a thickness about 100 angstroms.

26. The method of claim 22, wherein said first polysilicon layer is formed to have a thickness of approximately 1500–2000 angstroms.

27. The method of claim 22, wherein said second polysilicon layer is formed to have a thickness of approximately 1000–2000 angstroms.

28. The method of claim 22, wherein said tungsten silicon layer is formed to have a thickness of approximately 1000 angstroms.

29. The method of claim 22, wherein the dosage of said ion implantation to form said n source/drain is about 4E15 atom/cm$^2$.

30. The method of claim 29, wherein the energy of said ion implantation to form said n source/drain is about the range of 40 eV.

31. The method of claim 22, wherein the dosage of said ion implantation to form said p source/drain is about 3E15 atom/cm$^2$.

32. The method of claim 31, wherein the energy of said ion implantation to form said p source/drain is about the range of 30 eV.

33. The method of claim 22, wherein the etchant of said etch to form said bit line is HBr.

* * * * *